United States Patent
Delaet et al.

(10) Patent No.: US 10,600,538 B2
(45) Date of Patent: Mar. 24, 2020

(54) PERMANENT MAGNET COMPRISING A STACK OF N PATTERNS

(71) Applicant: Commissariat a l'energie atomique et aux energies alternatives, Paris (FR)

(72) Inventors: Bertrand Delaet, Bernin (FR); Sophie Giroud, Saint-Egreve (FR); Rachid Hida, Cras (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 15/480,741

(22) Filed: Apr. 6, 2017

(65) Prior Publication Data

US 2017/0294253 A1    Oct. 12, 2017

(30) Foreign Application Priority Data

Apr. 6, 2016  (FR) ...................................... 16 53013

(51) Int. Cl.
*H01F 1/047* (2006.01)
*G01R 33/038* (2006.01)
(Continued)

(52) U.S. Cl.
CPC ......... *H01F 1/047* (2013.01); *G01R 33/0052* (2013.01); *G01R 33/038* (2013.01);
(Continued)

(58) Field of Classification Search
CPC ........ H01F 1/047; H01F 10/002; H01F 10/30; H01F 10/16; H01F 41/0253; H01F 10/14; G01R 33/038; G01R 33/0052; G11B 5/39
See application file for complete search history.

(56) References Cited

U.S. PATENT DOCUMENTS 6,358,332 B1 * 3/2002 Gill ..................... B82Y 10/00
148/108
6,372,330 B1 * 4/2002 Do ...................... C23C 28/021
428/212
(Continued)

FOREIGN PATENT DOCUMENTS

DE   10 2007 032 299 A1   1/2009
EP       2 597 655 A1     5/2013
(Continued)

OTHER PUBLICATIONS

French Preliminary Search Report (with Written Opinion) dated Feb. 8, 2017 in French Application 16 53013 filed on Apr. 6, 2016 (with English Translation of Categories of Cited Documents).
(Continued)

*Primary Examiner* — Christopher P McAndrew
*Assistant Examiner* — Zannatul Ferdous
(74) *Attorney, Agent, or Firm* — Oblon, McClelland, Maier & Neustadt, L.L.P.

(57) ABSTRACT

A permanent magnet includes a stack of N patterns stacked immediately one above the other in a stacking direction, each pattern including an antiferromagnetic layer made of antiferromagnetic material, a ferromagnetic layer made of ferromagnetic material, the directions of magnetization of the various ferromagnetic layers of all the patterns all being identical to one another. At least one ferromagnetic layer includes a first sub-layer made of CoFeB whose thickness is greater than 0.05 nm, and a second sub-layer made of a ferromagnetic material different from CoFeB and whose thickness is greater than the thickness of the first sub-layer.

14 Claims, 2 Drawing Sheets

(51) Int. Cl.
    *H01F 41/02*      (2006.01)
    *H01F 10/16*      (2006.01)
    *H01F 10/30*      (2006.01)
    *H01F 10/00*      (2006.01)
    *G01R 33/00*      (2006.01)
    *H01F 10/14*      (2006.01)

(52) U.S. Cl.
    CPC ......... *H01F 10/002* (2013.01); *H01F 10/14* (2013.01); *H01F 10/16* (2013.01); *H01F 10/30* (2013.01); *H01F 41/0253* (2013.01)

(56) References Cited

U.S. PATENT DOCUMENTS

| | | | |
|---|---|---|---|
| 2003/0197984 A1* | 10/2003 | Inomata | B82Y 10/00 360/324.2 |
| 2004/0126620 A1* | 7/2004 | Viehland | G01R 33/02 360/328 |
| 2008/0241597 A1* | 10/2008 | Dieny | B82Y 25/00 428/811.2 |
| 2009/0046397 A1 | 2/2009 | Sun et al. | |
| 2010/0231205 A1* | 9/2010 | Jerance | G01D 5/145 324/207.23 |
| 2011/0151589 A1 | 6/2011 | Redon | |
| 2011/0304325 A1 | 12/2011 | Walther et al. | |
| 2015/0287907 A1* | 10/2015 | Park | H01L 43/08 257/421 |
| 2015/0301216 A1* | 10/2015 | Hautson | G01R 33/0094 324/247 |
| 2016/0079520 A1* | 3/2016 | Park | H01L 29/82 257/421 |
| 2017/0053724 A1* | 2/2017 | Delaet | G01R 33/0286 |

FOREIGN PATENT DOCUMENTS

| | | |
|---|---|---|
| FR | 2 892 871 A1 | 5/2007 |
| WO | WO 2009/137802 A1 | 11/2009 |
| WO | WO 2010/084165 A1 | 7/2010 |
| WO | WO 2015/166159 A1 | 11/2015 |

OTHER PUBLICATIONS

Dirk Ettelt, et al., "3D Magnetic Field Sensor Concept for Use in Inertial Measurement Units (IMUs)", Journal of Microeletromechanical Systems, vol. 23, (2), 2014, 10 pgs.

J. Nogues, et al., "Exchange bias", Journal of Magnetism and Magnetic Materials 192, 1999, 30 pgs.

Masakiyo Tsunoda, et al., "Exchange Anisotropy of Polycrystalline Ferromagnetic/Antiferromagnetic Bilayers", Journal of Magnetics 7(3), 2002, 14 pgs.

* cited by examiner

PERMANENT MAGNET COMPRISING A STACK OF N PATTERNS

The invention relates to a permanent magnet as well as to a magnetic field sensor incorporating this permanent magnet. The invention also relates to a process for fabricating this permanent magnet.

Known magnetic field sensors incorporate permanent magnets for measuring the amplitude, in a given direction, of a magnetic field to be measured. Such sensors are described, for example, with reference to FIG. 4 of application US2011/0151589 or with reference to FIGS. 1A to 8 of application WO2010/0084165. Other sensors are described in applications WO2015/166159A1 and DE102007032299A1.

The permanent magnets used in these sensors, in contradistinction to the pinned layers used in spin valves or GMR ("Giant Magnetoresistance") and in tunnel junctions or TMR ("Tunnel Magnetoresistance"), must generate a significant magnetic field. Recall that, in spin valves and tunnel junctions, the magnetic field generated by the pinned layer must on the contrary be weak so as to allow the direction of magnetization of the free layer to rotate and to align itself with the direction of an exterior magnetic field. Thus in the case of dynamic structures, such as MRAM (Magnetoresistive Random Access Memory) structures for example, the magnetization changes during the use of the structure. On the contrary, in permanent magnets, the direction of magnetization is fixed.

To obtain a significant magnetic field, in the known sensors, the permanent magnet is made of a stack of ferromagnetic layers and of antiferromagnetic layers. Typically, a permanent magnet such as this comprises a stack of N patterns stacked immediately one above the other in a stacking direction, where N is an integer number greater than or equal to two, each pattern comprising:
an antiferromagnetic layer made of antiferromagnetic material,
a ferromagnetic layer made of ferromagnetic material, the direction of magnetization of the ferromagnetic layer being fixed by an exchange coupling with the antiferromagnetic layer of this pattern, and the direction of magnetization of the ferromagnetic layer of N-1 patterns also being fixed by an exchange coupling with the antiferromagnetic layer of an immediately adjacent pattern in the stack, the directions of magnetization of the various ferromagnetic layers of all the patterns all being identical to one another.

In the known permanent magnets each ferromagnetic layer is wedged between two antiferromagnetic layers. Such embodiments of a permanent magnet are described with reference to FIG. 1A of application US 2011/0151589 and with reference to FIGS. 10A and 10B of application WO 2010/0084165.

In this description, when it is indicated that a layer or a sub-layer is "made of X" or when one speaks of an "X layer" or of a "layer of X" or of a "layer made of X", one is referring to a layer or a sub-layer in which the material X represents more than 95% of its mass, and generally, more than 98% or 99% of its mass.

By ferromagnetic and antiferromagnetic layers is meant layers made, respectively, of ferromagnetic material and of antiferromagnetic material.

Hereinafter, the magnetic field of a permanent magnet comprising a stack of ferromagnetic and antiferromagnetic layers is considered to be significant if the total magnetic moment of this magnet per unit area is greater than $50 \times 10^{-3}$ A and, preferably, greater than $500 \times 10^{-3}$ A or $1000 \times 10^{-3}$ A.

The magnetic moment per unit area of a permanent magnet comprising a stack of ferromagnetic and antiferromagnetic layers can easily be measured. For example, the magnetic moment of the permanent magnet is measured by the VSM ("Vibrating Sample Magnetometry") method. This method is well known. It is for example described in the following articles:
Simon Foner, "Versatile and Sensitive Vibrating-Sample Magnetometer", The review of scientific instruments, Volume 30, number 7, July 1959,
Christian Albrechts, "Vibrating Sample Magnetometry", University of Kiel, M106, 2011.

The magnetic moment thus measured is then divided by the volume of ferromagnetic material contained in this magnet to obtain its magnetization. Whatever the stack, the dimensions of the ferromagnetic layers can be easily measured, for example, by observing vertical sections through this stack with a microscope. In particular, these observations make it possible to measure the thickness $t_i$ of each ferromagnetic layer. Finally, the magnetization thus obtained is multiplied by the sum of the thicknesses $t_i$ of each ferromagnetic layer to obtain the magnetic moment of this magnet per unit area. Generally, the ferromagnetic layers of the stack all have the same area in a plane perpendicular to the direction of stacking of these layers. Consequently, it is also possible to divide the magnetic moment measured for the magnet by the area of the ferromagnetic layers, or by the area of the permanent magnet if it is equal to the area of the ferromagnetic layers, to obtain the magnetic moment per unit area.

The magnetization of a permanent magnet such as this typically exhibits a hysteresis cycle such as that represented in FIG. 1.

FIG. 1 will now be used to define certain terms. Curve 2 schematically represents the manner in which the magnetization, denoted B in the figures, of the permanent magnet changes as a function of the magnetic field H. More precisely, the magnetization B varies between two extreme values $B_{SL}$ and $B_{SH}$. When the magnetization of the permanent magnet approaches the value $B_{SH}$, its magnetization no longer increases appreciably even if the magnetic field H increases. To simplify FIG. 1, this non-appreciable increase in the magnetization B as a function of the field H has been represented by a horizontal line. The magnet is then said to be saturated. The same phenomenon occurs when the magnetization approaches the value $B_{SL}$ and as the magnetic field continues to decrease. Between these two extreme values, the curve 2 defines a hysteresis cycle 4. The cycle 4 comprises:
a curve 4A which falls as the magnetic field H decreases, and
a curve 4B which rises as the magnetic field H increases.

Curves 4A and 4B meet on one side in the neighbourhood of a point 4C and of the other side in the neighbourhood of a point 4D. Between these points 4C and 4D, the curves 4A and 4B are distinct. Beyond the point 4C and short of the point 4D, the curves 4A and 4B substantially coincide and, for significant fields in terms of absolute value, saturation is approached. Here, the point 4C is the closest to the ordinate axis.

At the level of the points 4C and 4D, the disparity between the curves 4A and 4B is equal to 2% of the value $B_R$, $B_R$ corresponding to the magnetization at zero field (that is to say for the field H=0).

In the case of permanent magnets formed by stacking ferromagnetic and antiferromagnetic layers, the hysteresis cycle 4 is, generally, shifted, for example as represented in FIG. 1. More precisely, the cycle 4 is shifted, with respect to the ordinate axis, by a value $H_{ex}$ hereinafter called the exchange field $H_{ex}$ or field $H_{ex}$. This field $H_{ex}$ is also known as the "exchange bias". Typically, the value of the field $H_{ex}$ corresponds to the value of the abscissa of the point situated mid-way between the two points where the cycle 4 cuts the abscissa axis. In this graph, the abscissa axis represents the magnetic field H.

The coercive field $H_c$ or field $H_c$ of the permanent magnet is the half-width of the cycle 4. Typically, its value is taken equal to the difference between the value of the field $H_{ex}$ and a point of intersection of the cycle 4 with the abscissa axis.

The field H* is also defined as being the smallest magnetic field onwards of which the hysteresis of the permanent magnet disappears, that is to say, as specified hereinabove, the magnetic field for which the hysteresis is less than 2% of the value $B_R$. Here, the value of the field H* is equal to the value of the abscissa of the point 4C.

It is desirable that the magnet exhibits a field H* that is as far away as possible from the ordinate axis. Indeed, this improves the insensitivity of this magnet to exterior magnetic disturbances. This makes it possible also to improve the dynamic range of the magnetic field sensors which incorporate such magnets.

The invention is aimed at satisfying this desire. For this purpose, the subject of the invention is a permanent magnet in accordance with Claim 1.

The embodiments of this permanent magnet can comprise one or more of the characteristics of the dependent claims.

These embodiments of the permanent magnet furthermore exhibit the following advantages:

The fact that the CoFeB sub-layer is at least 5 nm away from the interface between the ferromagnetic layer and the antiferromagnetic layer of the following pattern facilitates the deposition of this antiferromagnetic layer.

Making the permanent magnet with an aspect ratio of greater than or equal to two makes it possible to facilitate the alignment of the direction of magnetization of each ferromagnetic layer with the longitudinal direction of the permanent magnet during its fabrication.

The subject of the invention is also a magnetic field sensor and a process for fabricating the claimed permanent magnet.

The invention will be better understood on reading the description which follows, given solely by way of nonlimiting example while referring to the drawings in which.

In these figures, the same references are used to designate the same elements. Hereinafter in this description, the characteristics and functions that are well known to the person skilled in the art are not described in detail.

Figure 2:
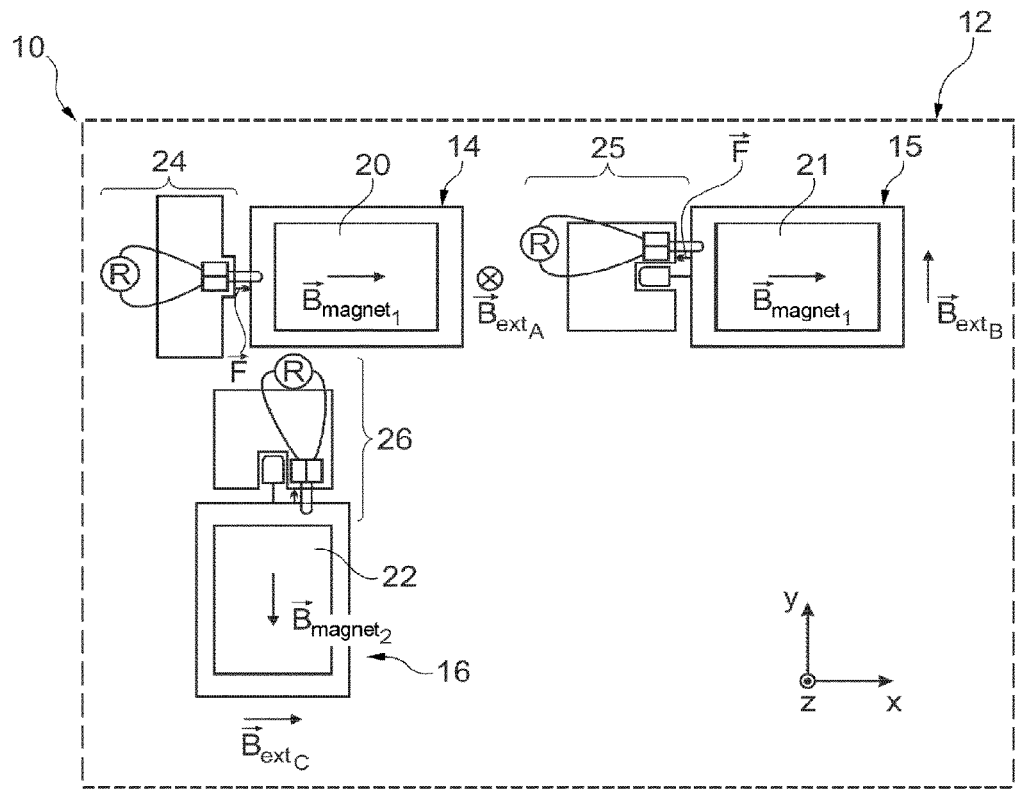
FIG. 2 is a schematic illustration, viewed from above, of a magnetic field sensor.

FIG. 2 represents a magnetic field sensor 10. This sensor 10 is identical to the sensor described with reference to FIG. 8 of application WO2010/084165, except as regards the structure of the permanent magnets used. Thus, only a brief description of the general architecture of this sensor is given in order to illustrate an exemplary embodiment of such a sensor.

This sensor 10 comprises:
a substrate 12 extending essentially in a horizontal plane parallel to orthogonal directions X and Y, and
three mono-axis magnetometers 14 to 16 made on the substrate 12.

A direction Z, perpendicular to the directions X and Y, represents the vertical. Hereinafter, the following figures are oriented with respect to this same frame X, Y, Z. Moreover, the terms such as "above", "below", "down", "up" are defined with respect to this direction Z.

The magnetometers 14 to 16 measure the amplitude of the magnetic field to be measured in the directions, respectively, Z, Y and X. For this purpose, each magnetometer 14 to 16 comprises:
a permanent magnet, respectively 20 to 22, able to displace with respect to the substrate 12, and
a transducer, respectively 24 to 26, able to transform the displacement of the permanent magnet into a corresponding variation of current or of voltage.

For example, the transducers 24 to 26 are piezoresistive transducers. Typically, these transducers are fixed, with no degree of freedom, on one side on the substrate 12 and, on another side, to the permanent magnet.

Here, the permanent magnets 20 to 22 are identical with the exception of the fact that the overall direction of the magnetic moment of the permanent magnet 22 is perpendicular to that of the permanent magnets 20 and 21. Henceforth, only a detailed description of the permanent magnet 20 is given hereinafter.

Figure 3:
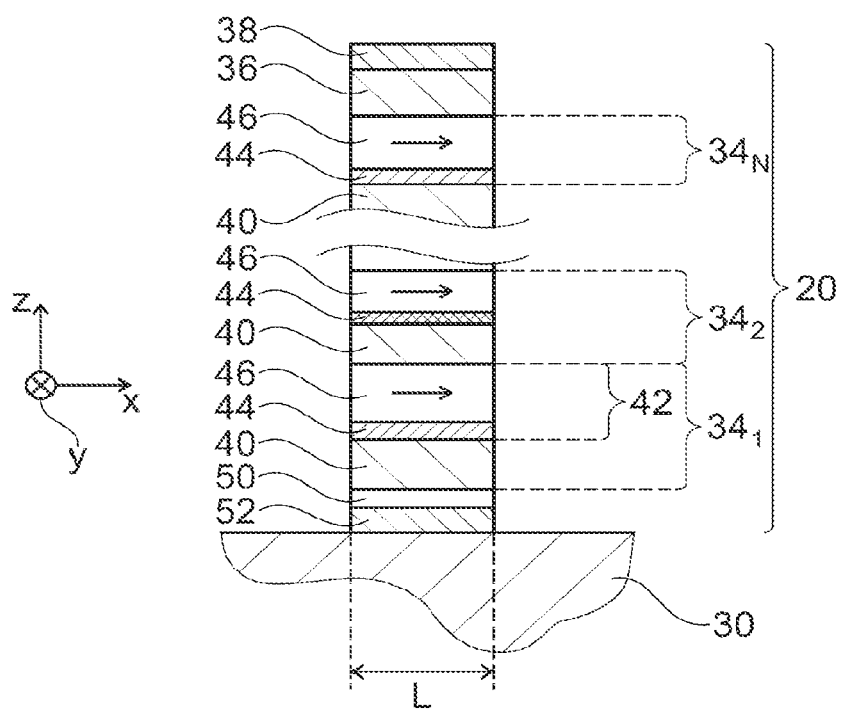
FIG. 3 is a schematic illustration, in longitudinal vertical section, of a permanent magnet of the sensor of FIG. 2.

FIG. 3 represents the permanent magnet 20 deposited on a base 30 that can move with respect to the substrate 12. For example, the base 30 is obtained by etching of the substrate 12. Only a portion of this base 30 is represented in FIG. 3.

The magnet 20 is formed of a stack, in a stacking direction, of ferromagnetic and antiferromagnetic layers. Here, the stacking direction is parallel to the direction Z. In FIG. 3 and the following figures, the following conventions are adopted:
the antiferromagnetic layers are hatched,
the direction of the magnetic moment of a ferromagnetic layer is represented by an arrow,
the wavy lines in the middle of the stack indicate that an intermediate portion of this stack has not been represented,
the proportions between the thicknesses of the various layers are not complied with so as to improve the readability of the figures, and
the proportion between the length L and the height of the stack is not complied with so as to reduce the size of the figures in the longitudinal direction of the stack.

Here, the stack exhibits a parallelepipedal shape and an aspect ratio of greater than or equal to 2, 5 or 20, or indeed even greater than 100 or 1000. In this embodiment, the aspect ratio is defined as being the ratio of the length L to the width W of the stack. Here, the length is parallel to the direction X and the width W is parallel to the direction Y.

The more significant the aspect ratio, the easier it is to align the direction of magnetization of the ferromagnetic layers with the longitudinal direction of the stack. For example, the width of the stack is less than 20 µm or 10 µm and the length L is greater than 50 µm or 100 µm or 1 mm. The height of the stack is generally greater than 100 µm or 500 µm. This height is measured between the layer of the stack that is closest to the base 30 and the layer of this same stack that is furthest from the base 30.

Here, the stack of ferromagnetic and antiferromagnetic layers is composed successively in the direction Z:

of a pattern 34 repeated N times, then of an antiferromagnetic layer 36 then, typically, of an encapsulation layer 38 deposited at the top of this stack.

The layer 38 is intended to protect the permanent magnet from chemical and/or physical attack from the exterior environment. This layer 38 is made of a non-magnetic material. By non-magnetic material is meant here a material devoid of magnetic property liable to disturb the operation of the permanent magnet. Generally, it would be a material whose magnetic properties are zero or not measurable.

Typically, the layer 38 is made of tantalum (Ta) or molybdenum (Mo) or ruthenium (Ru) or a combination of these materials. For example, the layer 38 is made of tantalum (Ta) and its thickness is greater than or equal to 10 nm.

The layer 36 is an antiferromagnetic layer. It is for example identical to the layer 40 described further on.

In this embodiment, the stacking direction of the patterns 34 is parallel to and directed in the same sense as the direction Z. The first occurrence of the pattern 34 in the stack, that is to say the one which is closest to the base 30, bears the reference $34_1$, the second occurrence immediately above this first occurrence $34_1$ bears the reference $34_2$ and so on and so forth until the occurrence $34_N$.

Here, the occurrences $34_1$ to $34_N$ are stacked directly one above the other and are not therefore separated from one another by any other layer not belonging to the pattern 34.

The number N of repetitions of the pattern 34 is generally chosen so as to achieve a desired height of the stack. This height depends on the application envisaged. N is greater than or equal to 2 and, preferably, greater than 5 or 10 or 20. N is also generally less than 50 or 100. Here, N is also chosen in such a way as to achieve the sought-after magnetic moment per unit area of the permanent magnet.

In this embodiment, the various occurrences of the pattern 34 are all identical to one another and only the occurrence $34_1$ will therefore be described in detail.

The occurrence $34_1$ is composed successively in the direction Z:

of an antiferromagnetic layer 40, and of a ferromagnetic layer 42 whose direction of magnetization is pinned by exchange coupling with the antiferromagnetic layer 40.

In this patent application, by "antiferromagnetic" layer is meant a horizontal layer of constant thickness in which the antiferromagnetic material or materials represent more than 95% or 98% or 99% of the mass of this layer.

In this description, the antiferromagnetic materials used are for example chosen among the group composed:

of manganese alloys, and of NiO, and of $Fe_2O_3$.

The antiferromagnetic alloys of manganese are typically PtMn, NiMn, PdPtMn, FeMn and IrMn. In this example, the antiferromagnetic material chosen for the layer 40 is the alloy IrMn.

In this patent application, by "ferromagnetic" layer is meant a horizontal layer of constant thickness in which the ferromagnetic material or materials represent more than 95% or 98% or 99% of the mass of this layer.

The ferromagnetic materials used are for example chosen among the group composed:

of alloys based on Fe and/or Co and/or Ni, such as for example CoFe, NiFe, CoFeSi, etc., and of Heusler alloys such as for example $Cu_2MnSn$ or $Co_2MnSi$ or $Ni_2MnAl$, etc.

In this embodiment, the direction of magnetization, that is to say the direction of the magnetic moment, of the layer 42 is parallel to and directed in the same sense as the direction X. Typically, the amplitude of the magnetization at saturation of the layer 42 is greater than or equal to 397887 A/m or 795774 A/m or 1432394 A/m.

This direction of magnetization is pinned by an exchange coupling with the layer 40. An exchange coupling between a ferromagnetic layer and an antiferromagnetic layer occurs if:

the ferromagnetic layer is deposited directly on the antiferromagnetic layer, or only separated from the antiferromagnetic layer by one (or several) very fine non-magnetic layer(s) whose total thickness is less than 0.5 nm and, preferably, less than 0.4 nm or 0.2 nm.

Exchange coupling between the ferromagnetic and antiferromagnetic layers is well known. For example, the reader can refer to the following article: J. Nogués and Ivan K. Schuller, "*Exchange bias*" Journal of magnetism and magnetic materials 192 (1999), 203-232.

Figure 1:
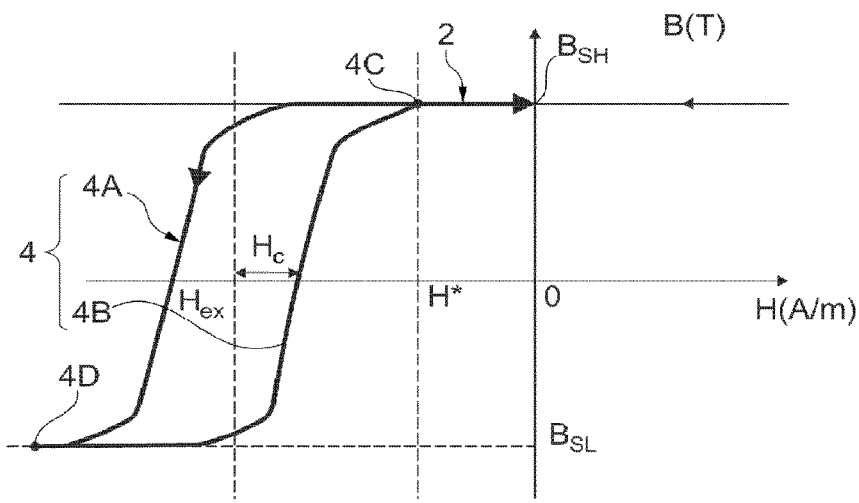
FIG. 1 is a schematic illustration of the hysteresis cycle of a permanent magnet made from a stack of ferromagnetic and antiferromagnetic layers.

The presence of the exchange coupling between the ferromagnetic layer and the antiferromagnetic layer is manifested especially by a shift, for example, towards the left as illustrated in FIG. 1, of the hysteresis cycle of the assembly of these two layers and therefore by the appearance of a non-zero field $H_{ex}$.

Here, the thicknesses of the layers 40 and 42 are chosen so as to obtain good exchange coupling between these two layers. In this description, it is considered that the exchange coupling is good if it is manifested by the appearance of an exchange field $H_{ex}$ whose absolute value is greater than 50 Oe (3978 A/m) and, preferably, greater than 100 Oe (7957 A/m) or 200 Oe (15915 A/m) or 500 Oe (39788 A/m) at 25° C.

The fields $H_{ex}$ and $H_c$ of a stack comprising only the layers 40 and 42 can be measured experimentally or obtained by numerical simulation.

Good exchange coupling makes it possible in case of a significant exterior magnetic disturbance to return to the initial state after this disturbance disappears.

The thickness of the layers 40 and 42 is, for example, determined by experimentation or by numerical simulation by successively testing different thicknesses for a stack formed only of an antiferromagnetic layer and of a ferromagnetic layer made from the same materials as the layers 40 and 42. For the commonest antiferromagnetic and ferromagnetic materials, the appropriate thicknesses are known to the person skilled in the art. For example, typically, the thickness of the layer 40 lies between 5 and 100 nm and, preferably, between 5 and 25 nm. The thickness of the layer 42 often lies between 0.5 nm and 100 nm. In this example, the thickness of the layer 40 preferably lies between $e_{FM}/3$ and $3e_{FM}$ so as to obtain good exchange coupling, where $e_{FM}$ is the thickness of the layer 42. Here, the thickness of the layer 40 is 7 nm while the thickness of the layer 42 is 20 nm.

The overall magnetic moment of the permanent magnet 20 is proportional to the sum of the magnetic moments of the layers 42 of the stack.

To distance the field H* from the ordinate axis, the layer 42 comprises a sub-layer 44 of CoFeB, and a sub-layer 46 made of a ferromagnetic material different from CoFeB.

In this description, the composition of a layer or of a sub-layer is denoted in the following manner: $A_xB_y$, where:

A and B are the symbols of the chemical elements making up this layer or sub-layer, and the index x is the mass of the element A in the layer or sub-layer, expressed as a percentage of the mass of this layer or sub-layer, and the index y is the mass of the element B in the layer or sub-layer, expressed as a percentage of the mass of this layer or sub-layer.

Here, the composition of the sub-layer 44 is denoted $Co_xFe_yB_z$. Preferably, the composition of the sub-layer 44 is such that z lies between 10% and 30% in terms of atomic mass. Advantageously, x and y will also each be chosen greater than or equal to 10%.

For example, the composition of the sub-layer 44 is as follows: $Co_{28}Fe_{52}B_{20}$ or $Co_{40}Fe_{40}B_{20}$ or $Co_{43}Fe_{43}B_{14}$.

The thickness of the sub-layer 44 is greater than 0.05 nm or 0.1 nm and, preferably, greater than 0.5 nm. Preferably, the maximum thickness of the sub-layer 44 is less than 10 nm and, advantageously, less than 5 nm or 2 nm.

In this embodiment, the sub-layer 44 is situated as close as possible to the layer 40. In this case, the sub-layer 44 is said to be situated at the interface between the layers 40 and 42 of the pattern 34. Here the sub-layer 44 is deposited directly on the layer 40.

The sub-layer 46 is, for example, made of a ferromagnetic material chosen among the group composed of cobalt, nickel, iron and their alloys. For example, the ferromagnetic material is often CoFe or NiFe. Here, the sub-layer 46 is made of CoFe. The composition of the sub-layer 46 is denoted $Co_aFe_b$. The percentages a, b of cobalt and of iron in the sub-layer 46 are different from the percentages x, y of these same elements in sub-layer 44. For example, the sub-layer 46 is made of $Co_{35}Fe_{65}$ or of $Co_{80}Fe_{20}$.

The thickness $e_{46}$ of the sub-layer 46 is strictly greater than the thickness $e_{44}$ of the sub-layer 44. Typically, the thickness $e_{46}$ is at least two or five or ten or twenty times greater than the thickness $e_{44}$.

In the embodiment illustrated in FIG. 3, the first pattern $34_1$ is deposited directly on a seed layer 50. The layer 50 can be, for example, a layer of non-magnetic material used to facilitate the deposition, for example by epitaxial growth, of the layer 40. The layer 50 is for example a ruthenium layer 3 nm thick. Here, the layer 50 is itself deposited directly on a buffer layer 52. The layer 52 is for example a tantalum layer 5 nm thick. The layer 52 is deposited directly on the base 30. Other variants are of course possible and especially a single layer serving both as seed layer and as buffer layer.

Figure 4:
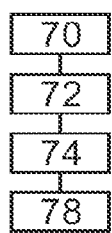
FIG. 4 is a flowchart of a process for fabricating the permanent magnet of FIG. 3.

FIG. 4 represents a process for fabricating the permanent magnet 20. More precisely, during a step 70, the various layers described with reference to FIG. 3 are deposited one above the other. Accordingly, methods known in the field of microtechnologies and the production of electronic chips are used. During step 70, no particular shaping is given to this stack of layers. This stack covers at least the locations where the magnets 20 to 22 have to be made.

During a step 72, this stack is structured so as to leave only bar-shaped stacks at the locations where the magnets 20 to 22 have to be made. Thus, on completion of this step, this leaves only bars having the required aspect ratios, that is to say generally greater than 2, 10 or 100.

Thereafter, during a step 74, the bars are heated so that the temperature of the antiferromagnetic layers exceeds their ordering temperature. This annealing is performed under a saturating magnetic field as described for example in application US 2011/0151589.

Thereafter as described for example in application US 2011/0151589, during a step 78, the bars are cooled under a weaker field until the exchange couplings between the ferromagnetic and antiferromagnetic layers appear and pin the directions of magnetization of each ferromagnetic layer. The permanent magnets 20 to 22 are thus obtained.

For the other steps of fabricating the sensor 10, the reader can refer to the patent applications cited previously in the introduction.

Various experiments have been carried out to show the benefit of introducing the sub-layer 44 within the ferromagnetic layer 42. The table hereinbelow summarizes the experimental results obtained.

| Magnet No. | $B_R$ (nWb) | $H_{ex}$ (Oe) | $H_c$ (Oe) | $H_{ex}/H_c$ | $H_{ex}-H_c$ | "squareness" | H* (Oe) |
|---|---|---|---|---|---|---|---|
| 1 | 22.52 | 156.7 | 34.21 | 4.58 | 122.49 | 0.9524 | 94.9 |
| 2 | 22.48 | 145.9 | 50.62 | 2.88 | 95.28 | 0.945 | 78 |
| 3 | 18.81 | 160.4 | 22.56 | 7.10 | 137.84 | 0.975 | 108.7 |
| 4 | 17.77 | 149.2 | 24.46 | 6.09 | 124.74 | 0.964 | 91.4 |
| 5 | 17.69 | 211 | 43.17 | 4.88 | 167.83 | 0.934 | 127 |
| 6 | 17.38 | 202.9 | 65.74 | 3.08 | 137.16 | 0.932 | 107 |

In the table hereinabove, the first column comprises the number of the magnet on which the measurements were carried out. Here, each magnet was made by implementing the process of FIG. 4 with the exception of step 72. Thus, the magnets tested are not structured and do not therefore stretch along a particular direction. To simplify the experimental measurements, each permanent magnet comprises only two patterns 34.

Hereinbelow, for each magnet number, the composition of each layer/sub-layer is given starting from the layer 52 and ending at the layer 38. In the lines hereinbelow, the composition of a layer is separated from the composition of the immediately preceding and following layers in the stack by the symbol "/". The numerical number, which is separated from the composition of the layer by a space, expresses the thickness of this layer in nanometres.

Magnet No. 1: Ta 5/Ru 3/$Ir_{20}Mn_{80}$ 10/$Co_{43}Fe_{43}B_{14}$ 1/$Fe_{65}Co_{35}$ 19/$Ir_{20}Mn_{80}$ 10/$Co_{43}Fe_{43}B_{14}$ 1/$Fe_{65}Co_{35}$ 19/$Ir_{20}Mn_{80}$ 10/Ta 10.

Magnet No. 2: Ta 5/Ru 3/$Ir_{20}Mn_{80}$ 10/$Fe_{65}Co_{35}$ 20/$Ir_{20}Mn_{80}$ 10/$Fe_{65}Co_{35}$ 20/$Ir_{20}Mn_{80}$ 10/Ta 10.

Magnet No. 3: Ta 5/Ru 3/$Ir_{20}Mn_{80}$ 10/$Co_{43}Fe_{43}B_{14}$ 1/$Co_{80}Fe_{20}$ 19/$Ir_{20}Mn_{80}$ 10/$Co_{43}Fe_{43}B_{14}$ 1/$Fe_{65}Co_{35}$ 19/$Ir_{20}Mn_{80}$ 10/Ta 10.

Magnet No. 4: Ta 5/Ru 3/$Ir_{20}Mn_{80}$ 10/$Fe_{65}Co_{35}$ 20/$Ir_{20}Mn_{80}$ 10/$Co_{80}Fe_{20}$ 20/$Ir_{20}Mn_{80}$ 10/ Ta 10.

Magnet No. 5: Ta 5/Ru 3/$Ir_{20}Mn_{80}$ 7/$Co_{43}Fe_{43}B_{14}$ 0.5/$Fe_{65}Co_{35}$ 15/$Ir_{20}Mn_{80}$ 7/$Co_{43}Fe_{43}B_{14}$ 0.5/$Fe_{65}Co_{35}$ 15/$Ir_{20}Mn_{80}$ 7/Ta 10.

Magnet No. 6: Ta 5/Ru 3/$Ir_{20}Mn_{80}$ 7/$Fe_{65}Co_{35}$ 15/$Ir_{20}Mn_{80}$ 7/$Fe_{65}Co_{35}$ 15/$Ir_{20}Mn_{80}$ 7/Ta 10.

The field $B_R$ of the table corresponds to the magnetic flux measured at zero field. It is expressed in nano-Webers (nWb). It is recalled that 1 Wb=1 $Tm^2$. The fields $H_{ex}$, $H_c$ and H* of the table are expressed in Oersteds (Oe). It is recalled that 1 Oe=$1000/(4\pi)$ A·$m^{-1}$. It is also recalled that H* corresponds to the magnetic field for which the hysteresis is less than 2% of the value of BR The "Squareness" column contains a value which is higher the closer the hysteresis cycle of the magnet is to a rectangle. This value is calculated with the aid of the following formula: Squareness=$(1-(B_R/(SlopeAtH_c*H_c)))$, where $SlopeAtH_c$ is the slope of the curve of the magnetization B as a function of the field H at the level of the point with abscissa $H_{ex}$–$H_c$.

The various measurements indicated in the table were obtained with the aid of a measurement apparatus known by the term "BH-Looper". Here, this is the MESA-200 apparatus marketed by SHB Instruments.

As shown by the measurements indicated in the table, for identical amounts of ferromagnetic and antiferromagnetic materials, the introduction of the sub-layer 44 into the ferromagnetic layer 42 makes it possible to move the field H* further from the ordinate axis than a magnet which is identical but devoid of the sub-layer 44. Moreover, the presence of the sub-layer 44 makes it possible also to increase the ratio $H_{ex}/H_c$. Thus, the permanent magnet 20 exhibits increased insensitivity to exterior magnetic disturbances since the field H* moves away from the ordinate axis, thereby improving the dynamic range of the sensor incorporating this permanent magnet since the hysteresis cycle of the magnet is squarer.

Finally, increasing the ratio $H_{ex}/H_c$ is also useful for fabricating the magnet 20 with the shape of an elongated bar. Indeed, it is known that shaping the permanent magnet in the form of an elongated bar having a significant aspect ratio increases the value of the field $H_c$ whilst the field $H_{ex}$ remains constant. Thus, if before a shaping the ratio $H_{ex}/H_c$ is not sufficiently significant, after shaping, the field H* is very close to zero or greater than zero so that this magnetized bar is then very sensitive to exterior magnetic disturbances.

Figure 5:
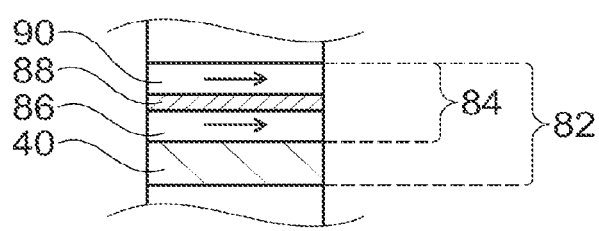
FIG. 5 is a schematic illustration, in longitudinal vertical section, of another possible embodiment for patterns of the permanent magnet of FIG. 3.

FIG. 5 represents a pattern 82 able to replace the pattern 34 in the magnet 20. The pattern 82 is identical to the pattern 34 except that the ferromagnetic layer 42 is replaced with a ferromagnetic layer 84. The layer 84 is identical to the layer 42 except that it is made by stacking three sub-layers one above the other. More precisely, it comprises, stacked directly one above the other in the direction Z:
a ferromagnetic sub-layer 86,
a sub-layer 88 of CoFeB, and
a ferromagnetic sub-layer 90.

The ferromagnetic sub-layers 86, 90 are made of a ferromagnetic material different from CoFeB. For example, they are made of the same ferromagnetic material as that described for the sub-layer 46. Here, the thickness of the sub-layer 90 is preferably greater than 5 nm so as to insulate the sub-layer 88 from the interface between the layer 84 and the antiferromagnetic layer deposited on this layer 84. This facilitates the fabrication of the stack of patterns 82.

Apart from its position within the layer 84, the sub-layer 88 is for example identical to the sub-layer 44.

Numerous other embodiments are possible. For example, the ferromagnetic layer can comprise several sub-layers 44, 88. For example, the ferromagnetic layer comprises two or three or four copies of the sub-layer 44 or 88 disposed inside the same ferromagnetic layer. Each copy of the sub-layer 44 or 88 is then separated from the following copy of this sub-layer 44 or 88 by a sub-layer 46, 86 or 90. One of the copies of the sub-layers 44 or 88 can be situated at the interface between this ferromagnetic layer and the antiferromagnetic layer situated just above or just below.

The ferromagnetic layers are not necessarily each formed of a single homogeneous block of ferromagnetic material. For example, each ferromagnetic layer can also be laminated as described in patent application FR 2 892 871 in the passage page 13, lines 5 to 9.

The ferromagnetic sub-layers 86 and 90 are not necessarily made of the same ferromagnetic material. For example, one of these sub-layers is made of CoFe and the other of NiFe.

The antiferromagnetic layer 40 can likewise be formed of a stack of several antiferromagnetic sub-layers. For example, the antiferromagnetic layer is formed of an IrMn sub-layer deposited directly on a PtMn sub-layer.

The antiferromagnetic layer 36 deposited on the ferromagnetic layer of the last pattern of the stack can be omitted. In this case, preferably, the thickness of the layer 42 of this last pattern is reduced with respect to the thickness of the layer 42 of the other patterns of the same stack.

It is also possible to combine, in one and the same stack, different patterns. For example, it is possible to construct a stack by alternating the patterns 34 and 82.

The ferromagnetic material used to form the ferromagnetic sub-layer 46, 86 or 90 can be different from one pattern to the other in the stack. For example, in one of the patterns of the stack, this ferromagnetic material is CoFe and in another of these patterns, this material is NiFe.

Similarly, the antiferromagnetic material used to form the layer 40 of a pattern can be different from one pattern to the other. For example, in one pattern, this antiferromagnetic material is IrMn and in another pattern, it is PtMn.

The buffer layer 52 can be omitted.

The order of the antiferromagnetic and ferromagnetic layers inside the patterns can be reversed. In this case, the ferromagnetic layer is situated under the antiferromagnetic layer.

The stack does not necessarily have a parallelepipedal shape. For example, the cross section of the stack parallel to the directions X, Y is an ellipse or an oval. In these latter cases, the aspect ratio of the permanent magnet is defined as being the ratio of the length to the width of the parallelepiped of smallest volume entirely containing the stack.

As a variant, the aspect ratio of the stack is not necessarily greater than or equal to two. For example, it can be equal to one.

In a simplified embodiment, the sub-layer 44 or 88 is introduced solely into only a part of the patterns of the stack. Thus, at least one pattern, and preferably at least 40% or 50% or 80% of the patterns of this stack, comprise this sub-layer 44 or 88.

The invention claimed is:

1. A magnet comprising a stack of N patterns stacked immediately one above the other in a stacking direction, where N is an integer number greater than or equal to two, each pattern comprising:
   i) an antiferromagnetic layer made of antiferromagnetic material,
   ii) a ferromagnetic layer made of ferromagnetic material, wherein
      the direction of magnetization of the ferromagnetic layer is fixed by an exchange coupling with the antiferromagnetic layer of this pattern, and
      the direction of magnetization of the ferromagnetic layer of N-1 patterns is fixed by an exchange coupling with the antiferromagnetic layer of an immediately adjacent pattern in the stack,
   wherein the directions of magnetization of the ferromagnetic layers of all the patterns in said stack are identical to one another,
   wherein at least one ferromagnetic layer in said stack comprises:
      a first sub-layer made of CoFeB whose thickness is greater than 0.05 nm, and a second sub-layer made of a ferromagnetic material different from CoFeB and whose thickness is greater than the thickness of the first sub-layer, wherein the magnet is a permanent magnet and wherein the permanent magnet has a total magnetic moment per unit area greater than $50 \times 10^{-3}$ A.

2. . The magnet according to claim 1, wherein the first sub-layer is disposed at a distance of greater than or equal to 5 nm from the interface between the ferromagnetic layer of the pattern and the antiferromagnetic layer of the following pattern in the stacking direction, so that no sub-layer made of CoFeB is situated less than 5 nm from the antiferromagnetic layer of the following pattern.

3. The magnet according to claim 2, wherein the first sub-layer is deposited directly on the antiferromagnetic layer of the pattern.

4. The magnet according to claim 2, wherein the ferromagnetic layer comprises a third sub-layer made of a ferromagnetic material different from CoFeB and the first sub-layer is situated between these second and third sub-layers.

5. The magnet according to claim 1, wherein the ferromagnetic layer of each pattern comprises a copy of the first sub-layer.

6. The magnet according to claim 1, wherein the thickness of the first sub-layer is less than 5 nm.

7. The magnet according to claim 1, wherein N is an integer number greater than or equal to five or ten.

8. The magnet according to claim 1, wherein the first sub-layer comprises between 10% and 30% by mass of boron.

9. The magnet according to claim 1, wherein the magnet exhibits an aspect ratio of greater than or equal to two, the aspect ratio being defined as the ratio of the length to the width of the parallelepiped of smallest volume entirely containing the stack and the direction of magnetization of each ferromagnetic layer of the permanent magnet is parallel to the length of this parallelepiped.

10. A magnetic field sensor comprising:
a substrate extending essentially in a plane perpendicular to the stacking direction,
at least one permanent magnet displaceable with respect to the substrate in response to a variation of the amplitude or of the direction of a magnetic field to be measured,
a transducer fixed on the substrate, able to convert a displacement of the permanent magnet into an electrical quantity representative of the amplitude or of the direction of the magnetic field to be measured,
wherein the permanent magnet is in accordance with claim 1.

11. A process for fabricating a permanent magnet in accordance with claim 1, said process comprising:
a) forming a stack comprising N patterns stacked immediately one above the other in a stacking direction, each pattern comprising:
an antiferromagnetic layer made of antiferromagnetic material, and
a ferromagnetic layer made of ferromagnetic material,
b) heating the stack so as to attain a temperature greater than an ordering temperature of the material of the magnetic layers of the stack,
c) when the temperature is greater than the ordering temperature, applying a first magnetic field so as to align the direction of magnetization of the ferromagnetic layers with a predetermined desired direction,
d) cooling the stack in the presence of a second magnetic field less than the first magnetic field so as to reveal an exchange coupling between the ferromagnetic layer and the antiferromagnetic layer of each pattern of the stack,
wherein step a) comprises forming, in at least one ferromagnetic layer:
a first sub-layer made of CoFeB whose thickness is greater than 0.05 nm, and
a second sub-layer made of a ferromagnetic material different from CoFeB, whose thickness is greater than the thickness of the first sub-layer.

12. The permanent magnet of claim 1, wherein the permanent magnet has a total magnetic moment per unit area greater than $1000 \times 10^{-3}$ A.

13. The permanent magnet of claim 1, wherein the permanent magnet has a total magnetic moment per unit area greater than $500 \times 10^{-3}$ A.

14. The permanent magnet of claim 1, wherein the each ferromagnetic layer contains more than 95% by mass of a ferromagnetic material.

* * * * *